US012805313B2

(12) United States Patent
Takeuchi et al.

(10) Patent No.: US 12,805,313 B2
(45) Date of Patent: Nov. 17, 2026

(54) SEMICONDUCTOR MODULE

(71) Applicant: Hitachi Power Semiconductor Device, Ltd., Hitachi (JP)

(72) Inventors: Yujiro Takeuchi, Hitachi (JP); Yukihiro Kumagai, Hitachi (JP); Takayuki Oouchi, Hitachi (JP); Takayuki Kushima, Hitachi (JP)

(73) Assignee: MINEBEA POWER SEMICONDUCTOR DEVICE INC., Ibaraki (JP)

( * ) Notice: Subject to any disclaimer, the term of this patent is extended or adjusted under 35 U.S.C. 154(b) by 279 days.

(21) Appl. No.: 18/569,679

(22) PCT Filed: May 9, 2022

(86) PCT No.: PCT/JP2022/019673

§ 371 (c)(1),
(2) Date: Dec. 13, 2023

(87) PCT Pub. No.: WO2022/270161

PCT Pub. Date: Dec. 29, 2022

(65) Prior Publication Data

US 2024/0274490 A1 Aug. 15, 2024

(30) Foreign Application Priority Data

Jun. 24, 2021 (JP) ................................ 2021-104723

(51) Int. Cl.

| | |
|---|---|
| ***H10W 40/22*** | (2026.01) |
| ***H10W 40/25*** | (2026.01) |
| ***H10W 70/40*** | (2026.01) |

(52) U.S. Cl.

CPC ....... *H10W 40/226* (2026.01); *H10W 40/255* (2026.01); *H10W 70/456* (2026.01); *H10W 70/461* (2026.01)

(58) Field of Classification Search

None

See application file for complete search history.

(56) References Cited

U.S. PATENT DOCUMENTS

2015/0034367 A1 2/2015 Nagatomo et al.

FOREIGN PATENT DOCUMENTS

| | | |
|---|---|---|
| JP | S63-110693 A | 5/1988 |
| JP | 2004-221516 A | 8/2004 |

(Continued)

OTHER PUBLICATIONS

Machine Translation of JP 2004-221516 (Year: 2004).*

International Search Report, mailed Aug. 2, 2022, for International Application No. PCT/JP2022/019673.

*Primary Examiner* — Anthony Ho

(74) *Attorney, Agent, or Firm* — Baker Botts L.L.P.

(57) ABSTRACT

Provided is a semiconductor module comprising a semiconductor chip, a wire formed on an insulating substrate, and a lead frame, the semiconductor module having a higher heat-dissipating effect than before. A semiconductor module 10 of the present invention comprises an insulating substrate 1, a wire 2 formed on the insulating substrate 1, a semiconductor chip 3, and a lead frame 4, and is characterized in that the semiconductor chip 3 has one surface connected to the wire 2 and another surface connected to the lead frame 4, the wire 2 has a floating wire to which the lead frame 4 is connected, and a connection point between the floating wire and the lead frame 4 is located at a corner of the insulating substrate 1.

5 Claims, 5 Drawing Sheets

(56) References Cited

FOREIGN PATENT DOCUMENTS

| | | | |
|---|---|---|---|
| JP | 2008-171963 | A | 7/2008 |
| JP | 2014-222788 | A | 11/2014 |
| JP | 2016-146450 | A | 8/2016 |
| JP | 2017-054842 | A | 3/2017 |

* cited by examiner

SEMICONDUCTOR MODULE

TECHNICAL FIELD

The present invention relates to a semiconductor module.

BACKGROUND ART

Conventionally, there is known a semiconductor module including a lead frame for connecting a semiconductor chip fixed to an insulating substrate and external wirings. For example, PTL 1 described below discloses a semiconductor package 100 on which a wiring substrate 10 is mounted, the wiring substrate 10 including: an insulating substrate 11 that is constituted of a ceramic material and on one main surface of which there is formed a wiring layer on which components are mounted; and a base plate 13 that is disposed on the other side of the insulating substrate 11, has a protruding portion 13*c* protruding outward from an outer peripheral edge of the insulating substrate 11, and has a thickness larger than the thickness of the insulating substrate 11. An emitter wiring pattern 12*a* for connection of an emitter electrode of a semiconductor chip 20 and a collector wiring pattern 12*b* for connection of the collector electrode are connected to external electrodes by a lead frame (emitter terminal 18*a* and collector terminal 18*b*).

CITATION LIST

Patent Literature

PTL 1: JP 2017-054842 A

SUMMARY OF INVENTION

Technical Problem

In PTL 1 described above, a cooling structure portion 40 can be fixed with the protruding portion 13*c* of the base plate 13 disposed on the lower surface of the wiring substrate 10; therefore, it is not necessary to use an adhesive having a large thermal resistance such as silicon grease in order to fix the cooling structure portion 40, so that high cooling performance is supposed to be achieved.

However, in order to cope with an increase in current and an increase in integration accompanying an increase in performance and a reduction in size of a semiconductor module, it is required to further enhance a heat dissipation effect for a semiconductor chip as compared with the conventional art.

The present invention has been made in view of the above circumstances, and an object of the present invention is to provide a semiconductor module having a higher heat dissipation effect than before in a semiconductor module including a semiconductor chip, wires formed on an insulating substrate, and a lead frame.

Solution to Problem

One aspect of the present invention for achieving the above object is a semiconductor module including: an insulating substrate; a wiring formed on the insulating substrate; a semiconductor chip; and a lead frame, wherein the semiconductor chip has one surface connected to the wiring and another surface connected to the lead frame, the above wiring includes a floating wiring to which the lead frame is connected, and a connection point between the floating wiring and the lead frame is located at a corner part of the insulating substrate.

A more specific configuration of the present invention is described in the claims.

Advantageous Effects of Invention

The present invention makes it possible to provide a semiconductor module having a higher heat dissipation effect than before in a semiconductor module including a semiconductor chip, a wiring formed on an insulating substrate, and a lead frame.

Problems, configurations, and advantageous effects other than the above-described will be clarified by the following description of the embodiment.

DESCRIPTION OF EMBODIMENTS

Figure 1:
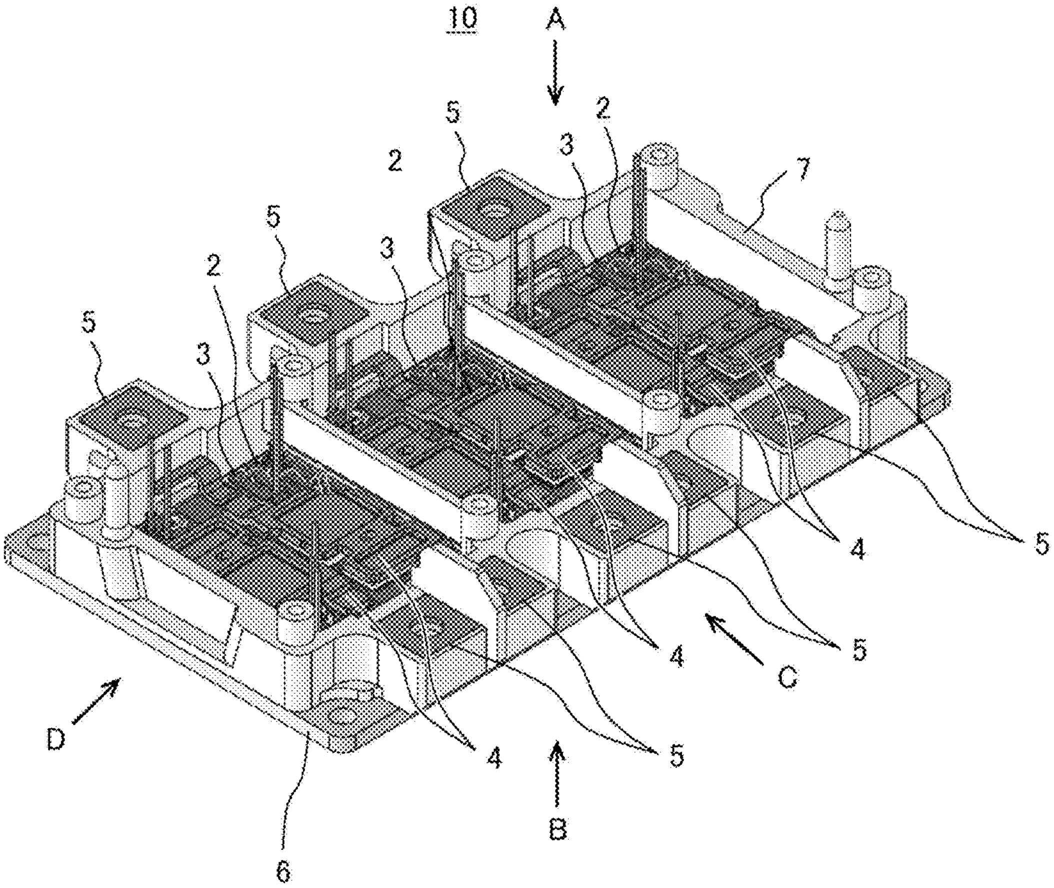
FIG. 1 is a perspective view illustrating an example of a configuration of a power semiconductor module of the present invention.
Figure 2:
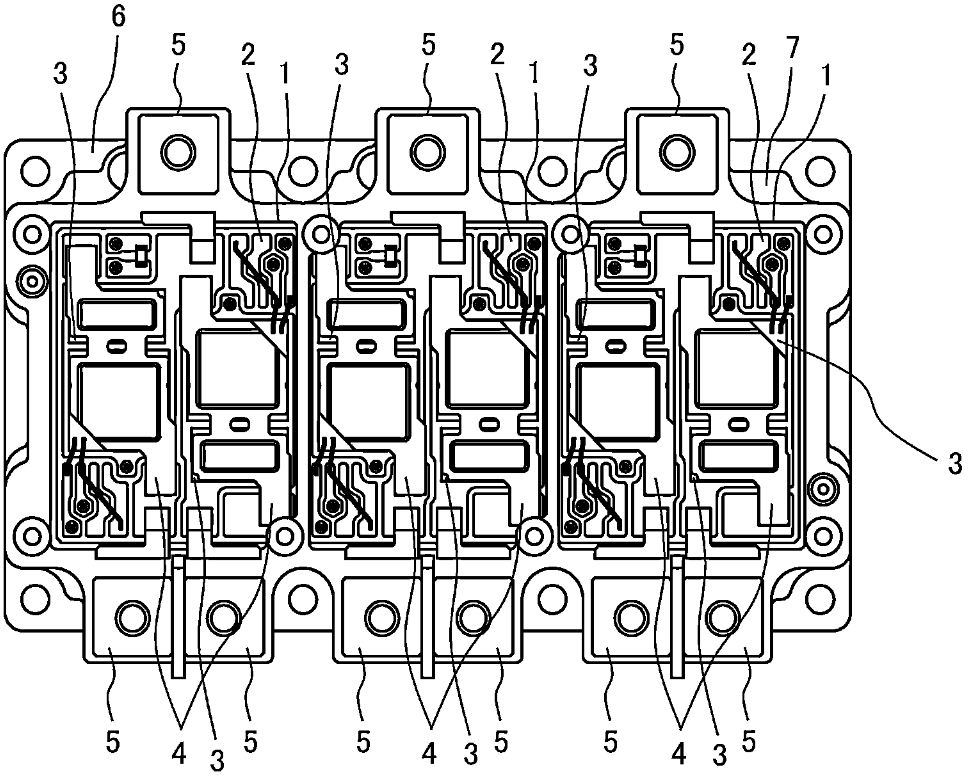
FIG. 2 is a top view of the power semiconductor module as viewed from direction A in FIG. 1.
Figure 3:
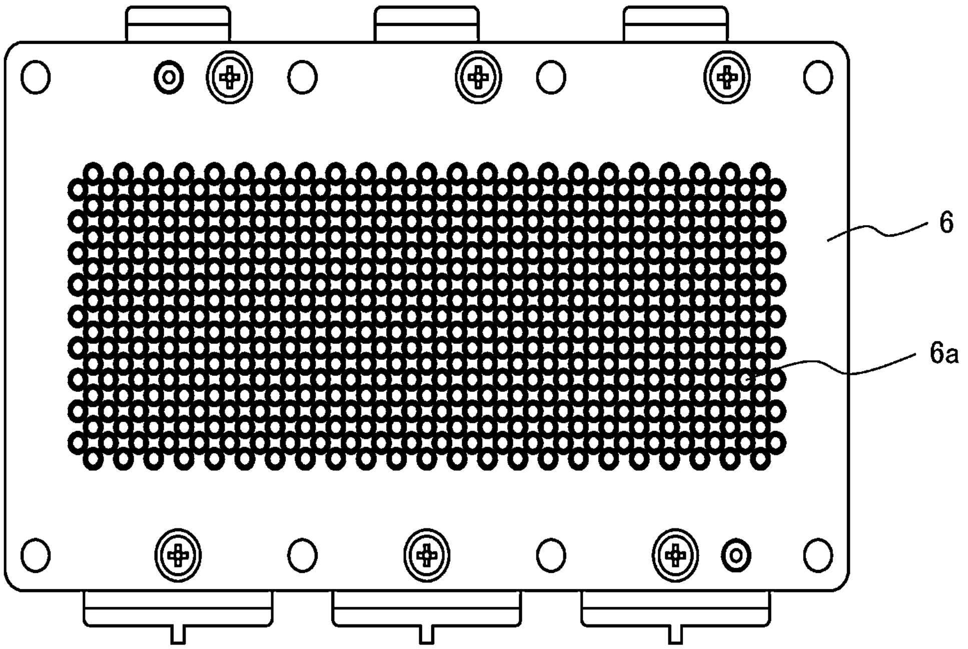
FIG. 3 is a bottom view of the power semiconductor module as viewed from direction B in FIG. 1.
Figure 4:
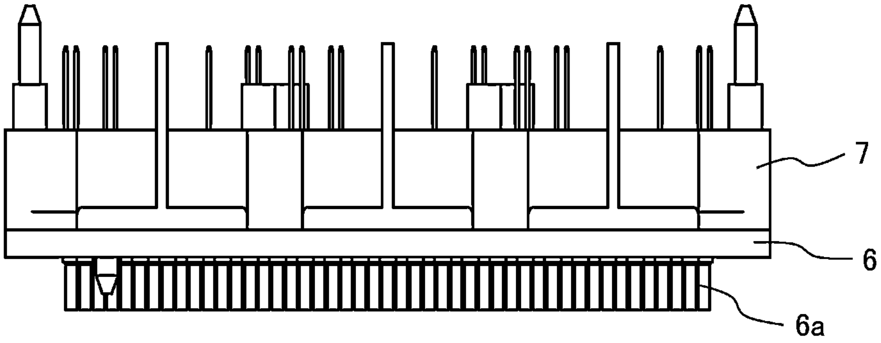
FIG. 4 is a side view of the power semiconductor module as viewed from direction C in FIG. 1.
Figure 5:
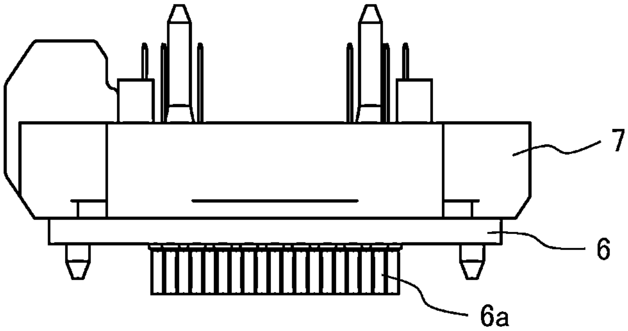
FIG. 5 is a side view of the power semiconductor module as viewed from direction D in FIG. 1.

Hereinafter, a semiconductor module of the present invention will be described in detail with reference to the drawings. FIG. 1 is a perspective view illustrating an example of a configuration of the power semiconductor module of the present invention, FIG. 2 is a top view of the power semiconductor module viewed from direction A in FIG. 1, FIG. 3 is a bottom view of the power semiconductor module viewed from direction B in FIG. 1, FIG. 4 is a side view of the power semiconductor module viewed from direction C in FIG. 1, and FIG. 5 is a side view of the power semiconductor module viewed from direction D in FIG. 1. As illustrated in FIGS. 1 and 2, in a semiconductor module 10 according to an embodiment of the present invention, wirings 2, semiconductor chips 3, and lead frames 4 are stacked in this order on surfaces of insulating substrates 1. One surfaces of the semiconductor chips 3 are connected to the wirings 2 formed on the insulating substrates 1, and the other surfaces are connected to the lead frames 4. Here, an example is described in which diode chips and IGBT chips are used as the semiconductor chips 3, but the present invention is not limited to the example.

A plurality of insulating substrates 1 (three insulating substrates 1 in FIGS. 1 and 2) are accommodated in a resin case 7. Although not illustrated, the surfaces of the insulating substrates 1 are sealed with an insulating resin together with the semiconductor chips 3 the wirings 2, and the lead frames 4. The materials of the insulating substrates 1 and the wirings 2 are not particularly limited, but for example, ceramics can be used for the insulating substrates 1, and copper can be used for the wirings 2.

As illustrated in FIGS. 3 to 5, a heat dissipation member 6 having at least a base plate is provided on surfaces on the sides of the insulating substrates 1 opposite to the surfaces on which the semiconductor chips 3 are provided. The heat dissipation member 6 may further include heat dissipation fins 6*a*. A configuration of the heat dissipation fins 6*a* may have cylindrical shape as illustrated or flat plate shapes (not illustrated). A method for cooling the heat dissipation member 6 may be an air-cooling method or a water-cooling method. In the case of an air-cooling method, for example, it is possible to provide a fan to cool the heat dissipation member 6 and the heat dissipation fins 6*a*. In the case of a water-cooling method, for example, it is possible to provide a cooling passage so that water or a cooling medium comes into contact with the heat dissipation member or the heat dissipation fins 6*a*.

Figure 6:
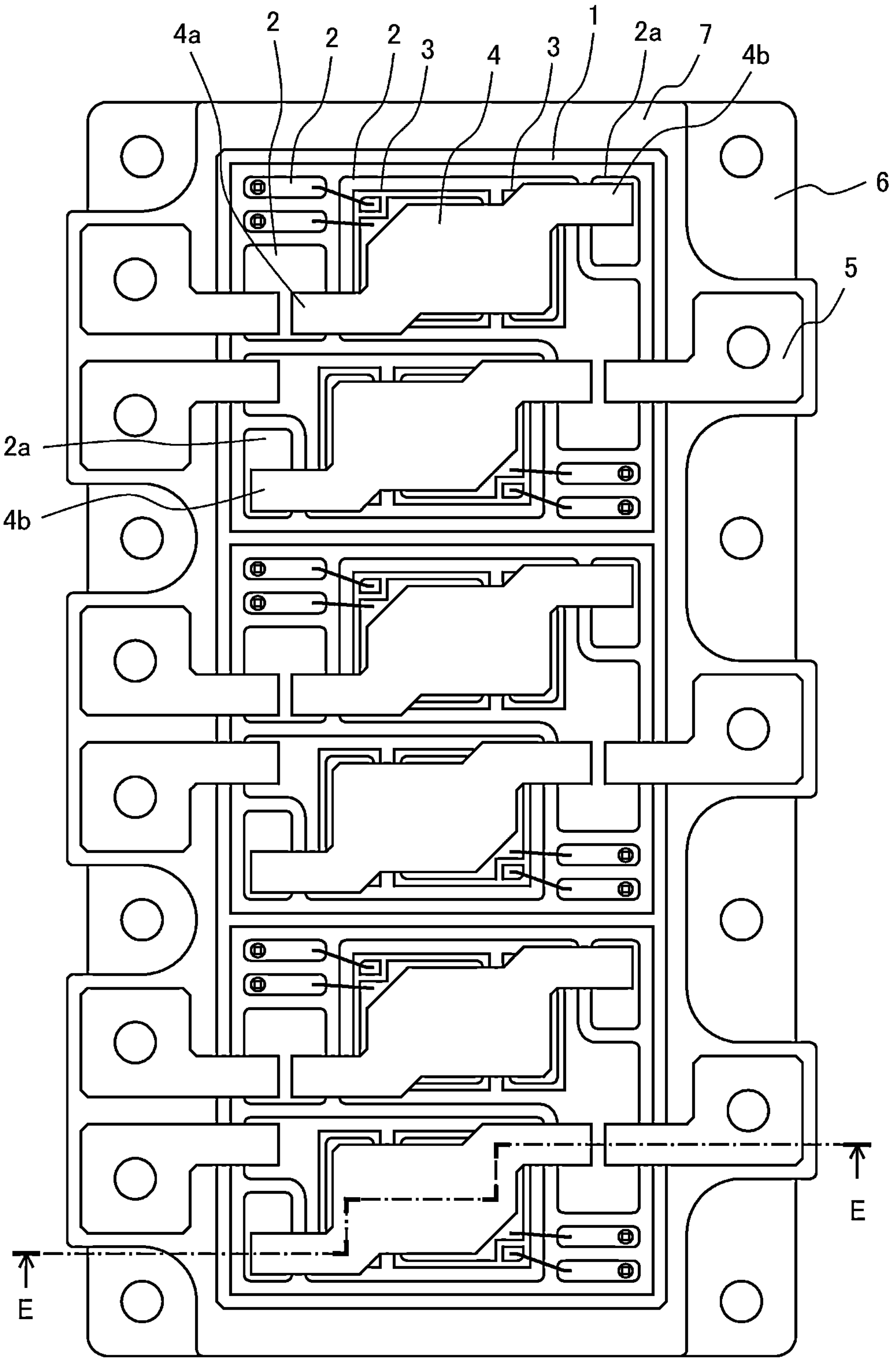
FIG. 6 is a view in which a configuration of a part of the top view in FIG. 1 is simplified.
Figure 7:
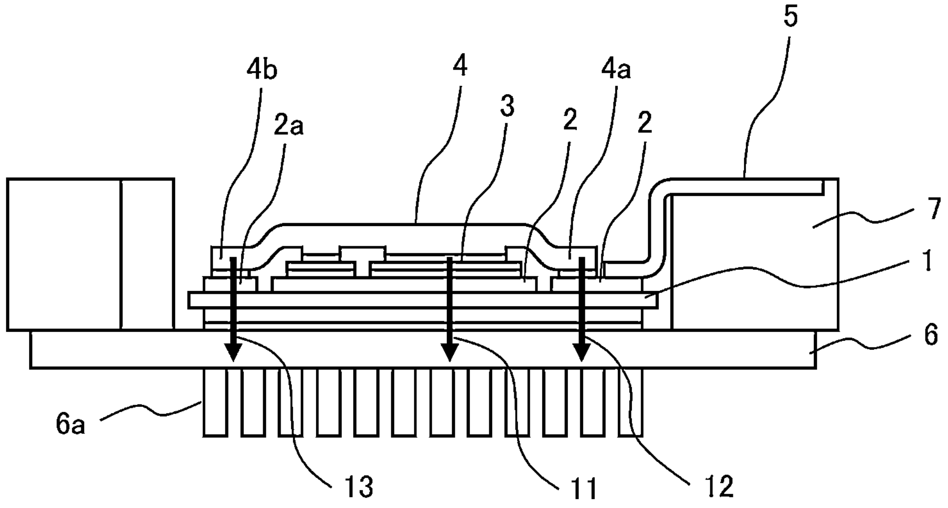
FIG. 7 is a sectional view of the power semiconductor module viewed from section E-E in FIG. 6.

FIG. 6 is a view in which a configuration of a part of the top view in FIG. 1 is simplified, and FIG. 7 is a sectional view of the power semiconductor module viewed from section E-E in FIG. 6. FIG. 6 illustrates a simplified shape of the lead frame 4 in FIG. 2. As illustrated in FIG. 6, the lead frames 4 are connected to the wirings 2 via first connection points 4*a*. Terminals 5 are provided, for example, on both sides of the insulating substrates 1, and currents from the terminals 5 on one sides pass through the wirings 2 and are conducted to the terminals 5 on the other sides via the semiconductor chips 3 and the lead frames 4.

Here, in the present embodiment, separately from the wirings used as circuits such as current paths between, for example, the terminals 5 on both sides, floating wirings 2*a* that are floating wirings not used as circuits are used as the wirings 2. Then, the floating wirings 2*a* and the lead frames 4 are connected to each other at the position of the second connection points 4*b* at corner parts of the insulating substrates 1.

As illustrated in FIG. 7, immediately below the semiconductor chip 3, the heat generated from the semiconductor chip 3 is conducted to the heat dissipation member 6 via the wiring 2 and insulating substrate 1, and is dissipated (heat dissipation path 11). In addition, the heat generated from the semiconductor chip 3 is conducted to the first connection point 4*a* via the lead frame 4, is conducted to the heat dissipation member 6 via the wiring 2 and the insulating substrate 1, and is dissipated (heat dissipation path 12).

The above heat dissipation paths exist also in the conventional structure, but in the present invention, the heat generated from the semiconductor chip 3 is further conducted to the second connection point 4*b* via the lead frame 4. The heat conducted to the second connection point 4*b* is conducted to the heat dissipation member 6 via floating wiring 2*a* and the insulating substrate 1, and is dissipated (heat dissipation path 13).

As described above, by connecting the floating wirings 2*a* of the wirings 2, which do not function as wirings, to the lead frames 4, the heat dissipation effect can be enhanced by, in addition to the heat dissipation paths 11 and 12 of the conventional configuration, the heat dissipation paths 13 that conduct the heat from the lead frames 4 to the floating wirings 2*a*, the insulating substrates 1, and the heat dissipation member 6.

Since the floating wirings 2*a* are provided at the corner parts of the insulating substrates 1, the heat dissipation paths 13 can be added without interfering with the conventional heat dissipation paths 11, 12, so that the heat dissipation effect can be enhanced.

For the same reason, to enhance a heat dissipation effect, the second connection points 4*b* between the floating wirings 2*a* and the lead frames 4 are preferably located on the further outer peripheral sides of the insulating substrates 1 than the first connection points 4*a*, which are the other connection points between the lead frames 4 and the wirings 2.

When the insulating substrates 1 are formed of ceramics and the wirings 2 are formed of copper, the thickness of the lead frames 4 is preferably equal to or more than 1.0 mm and equal to or less than 1.2 mm. From the viewpoint of reducing thermal resistance, it is preferable that the thickness of the lead frames 4 is thick (the thicker read frames 4 conduct heat more easily) (the heat dissipation effect via the heat dissipation paths 12 and 13 is enhanced). On the other hand, from the viewpoint of improving thermal fatigue resistance, the thickness of the lead frames 4 is preferably thin (because the copper lead frames 4 have a thermal expansion coefficient larger than the thermal expansion coefficient of the ceramics insulating substrates 1, the thinner the copper lead frames 4 are, the smaller the thermal stress is).

As a result of examination by the present inventor, the thickness of the lead frames 4 is preferably equal to or more than 1.0 mm and equal to or less than 1.2 mm to balance thermal resistance reduction and thermal fatigue resistance. The thermal fatigue due to the difference in thermal expansion coefficient between the insulating substrates 1 and the lead frames 4 is larger at the corner parts of the insulating substrates 1 where the second connection points 4*b* are provided; however, by setting the thickness of the lead frames 4 within the above range, it is possible to balance the thermal resistance reduction and the thermal fatigue resistance.

Preferably, the heat dissipation member 6 is disposed so as to overlap with the floating wirings 2*a* with the insulating substrates 1 interposed therebetween. By providing the heat dissipation member 6 immediately below the floating wirings 2*a* that release the heat from the semiconductor chips 3, the path length of the heat dissipation paths 13 is minimized, and the heat dissipation effect can therefore be enhanced. When the heat dissipation member 6 has the heat dissipation fins 6*a*, the heat dissipation fins 6*a* are preferably disposed so as to overlap with the floating wirings 2*a* with the insulating substrates 1 interposed therebetween.

As described above, it has been shown that the present invention makes it possible to provide a semiconductor module having a higher heat dissipation effect than before, in a semiconductor module including a semiconductor chip, a wiring formed on an insulating substrate, and a lead frame.

Note that the present invention is not limited to the above-described embodiment and includes various modifications.

For example, the above-described embodiment has been described in detail for easy understanding of the present invention, and the present invention is not necessarily limited to an embodiment including all the described configurations. In addition, a part of the configuration of a certain embodiment can be replaced with a configuration of another embodiment, and a configuration of another embodiment can be added to a configuration of a certain embodiment. In addition, another configuration may be added to, removed from, or substituted for a part of the configuration of each embodiment.

REFERENCE SIGNS LIST

1 insulating substrate
2 wiring
2*a* floating wiring

3 semiconductor chip
4 lead frame
4*a* first connection point
4*b* second connection point
5 terminal
6 heat dissipation member
6*a* heat dissipation fin
7 resin case
10 semiconductor module
11, 12, 13 heat dissipation path

The invention claimed is:

1. A semiconductor module comprising:

an insulating substrate;

a wiring formed on the insulating substrate;

a semiconductor chip;

a lead frame, and a heat dissipation member on a surface on a side of the insulating substrate opposite to the semiconductor chip, wherein the semiconductor chip has one surface connected to the wiring and another surface connected to the lead frame, the wiring includes a floating wiring to which the lead frame is connected, a connection point between the floating wiring and the lead frame is located at a corner part of the insulating substrate, the heat dissipation member is disposed to overlap the floating wiring with the insulating substrate interposed between the heat dissipation member and the floating wiring, the insulating substrate and the heat dissipation member are connected without any gap between them over an entire area where they overlap with the floating wiring.

2. The semiconductor module according to claim 1, wherein the connection point between the floating wiring and the lead frame is located on a further outer peripheral side of the insulating substrate than another connection point between the lead frame and the wiring.

3. The semiconductor module according to claim 1, wherein the insulating substrate is formed of ceramics, and the lead frame is formed of copper.

4. The semiconductor module according to claim 3, wherein the lead frame has a thickness equal to or more than 1.0 mm and equal to or less than 1.2 mm.

5. The semiconductor module according to claim 1, wherein the heat dissipation member includes a heat dissipation fin, and the heat dissipation fin is disposed to overlap the floating wiring with the insulating substrate interposed between the heat dissipation fin and the floating wiring.

* * * * *